United States Patent [19]

Webb

[11] Patent Number: 4,587,544
[45] Date of Patent: May 6, 1986

[54] AVALANCHE PHOTODETECTOR

[75] Inventor: Paul P. Webb, Beaconsfield, Canada

[73] Assignee: RCA Inc., Toronto, Canada

[21] Appl. No.: 650,728

[22] Filed: Sep. 14, 1984

[30] Foreign Application Priority Data

Apr. 10, 1984 [CA] Canada .................. 451637

[51] Int. Cl.⁴ .................. H01L 27/14; H01L 31/00
[52] U.S. Cl. .................. 357/30; 357/13; 357/16
[58] Field of Search .................. 357/30, 13, 16, 61, 357/55, 56

[56] References Cited

U.S. PATENT DOCUMENTS

| | | | |
|---|---|---|---|
| 4,116,733 | 9/1978 | Olsen et al. | 148/175 |
| 4,442,444 | 4/1984 | Osaka | 357/13 |
| 4,471,370 | 9/1984 | Chen et al. | 357/30 |
| 4,473,835 | 9/1984 | Forrest et al. | 357/13 |
| 4,481,523 | 12/1984 | Osaka et al. | 357/13 |

OTHER PUBLICATIONS

Nishida et al., Applied Physics Letters 35, 251 (1979).
Olsen et al., Journal of Electronic Materials 9, 977 (1980).

Primary Examiner—James W. Davie
Assistant Examiner—Georgia Y. Epps
Attorney, Agent, or Firm—Birgit E. Morris; Donald S. Cohen; William J. Burke

[57] ABSTRACT

The invention relates to an avalanche photodetector having a charge-multiplication region which is spatially separated from the detector surfaces. This photodetector includes an absorptive region, a first region overlying the absorptive region, a second region overlying the first region and having a central zone which is thinner than a peripheral zone and a third region overlying the second region. The high electric field required for avalanche multiplication is then restricted to the portion of the first region adjacent the central zone while the field at the periphery is less than that necessary for avalanche multiplication.

6 Claims, 4 Drawing Figures

AVALANCHE PHOTODETECTOR

The Governments of the United States of America and Canada have rights in this invention pursuant to Canadian Sub-Contract No. 14SU70C33-81-R-0122 under Contract No. F19628-82-C-0038 awarded by the U.S. Department of the Air Force.

The invention relates to an avalanche photodetector having a lower electric field at the P-N junction periphery thereby reducing the surface leakage current and the likelihood of edge breakdown.

BACKGROUND OF THE INVENTION

Optical communication systems which operate in the wavelength range from 1100 to 1700 nanometers (nm) are of potentially great importance because the dispersion and losses in an optical fiber are typically very low in this wavelength range. Heterojunction devices incorporating binary III–V alloys and solid solutions of these alloys have been found to be particularly useful for this application because their electronic bandgaps occur in this wavelength range and lattice-matched heterojunctions can be obtained by compositional variations. In particular, ternary and quaternary alloys of In, Ga, As and P on an InP substrate have been found to be useful materials for both light-emitters and detectors.

Problems which have affected the performance of avalanche photodetectors using these materials include bulk tunneling currents which occur at electric fields of the order of $1.5 \times 10^5$ V/cm in the ternary and quaternary compounds used for the light-absorptive region, edge breakdown and multiplication of surface leakage currents at the junction periphery. The tunneling has been reduced by locating the P-N junction with its high electric field in a wide bandgap material separated from the absorptive region in the narrower bandgap material. This is the so-called SAM (Separated Absorbing and Multiplying) avalanche photodetector structure.

Edge breakdown and surface currents have been reduced by surface contouring of the detector sidewalls. However, the electrical field reduction at the surface may be small with the result that the surface dark current may still undergo multiplication. Therefore, it is desirable to further reduce the electric field at the junction periphery to further limit the surface electric field and current.

SUMMARY OF THE INVENTION

An avalanche photodetector includes an absorptive region with a first region of the same conductivity type overlying the absorptive region. A low-conductivity second region having a central zone which is thinner than a surrounding peripheral zone overlies the first region. A third region of opposite conductivity type overlies the second region. The electric field under reverse bias is always higher in the portion of the first region adjacent to the central zone than in the portion adjacent to the peripheral zone so that avalanche multiplication will not occur at the detector surfaces.

DETAILED DESCRIPTION OF PREFERRED EMBODIMENTS

Figure 1:
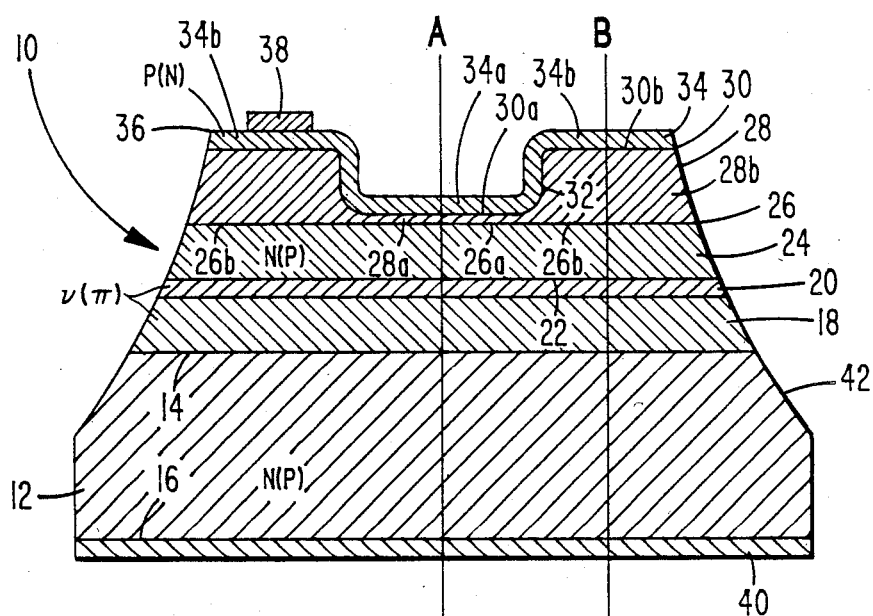
FIGS. 1 and 2 are cross-sectional views of two embodiments of the avalanche photodetector of the invention.
Figure 2:
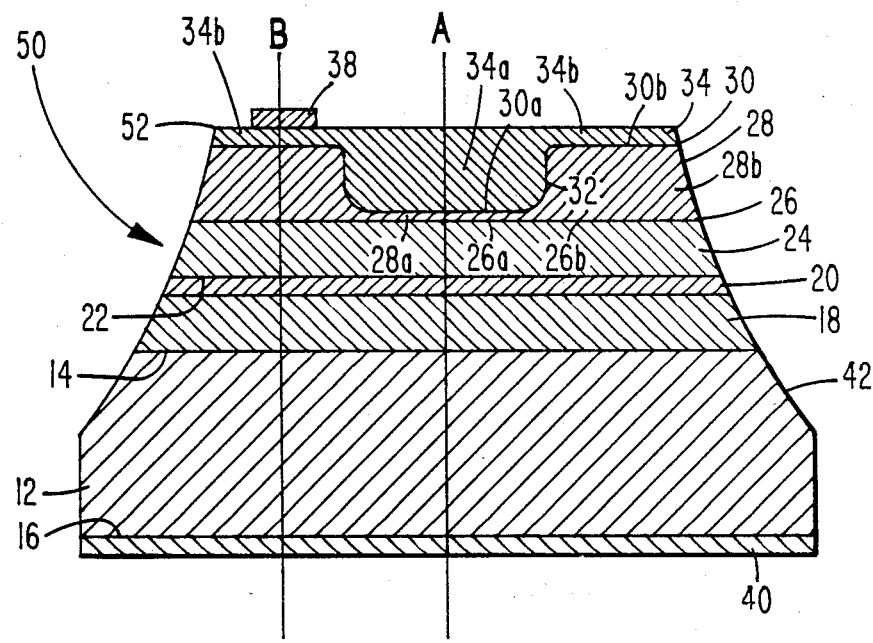

In FIGS. 1 and 2 the numerical identification of the same elements is the same.

The photodetector 10 shown in FIG. 1 includes a substrate 12 having first and second major surfaces 14 and 16, respectively, an absorptive region 18 is on the first major surface 14 and a buffer region 20 having a surface 22 is on the absorptive region 18. A first region 24 is on the surface 22 and has a surface 26 comprising a central area 26a surrounded by a peripheral area 26b. A second region 28 is on the first region 24 and has a surface 30 including a central surface portion 30a and a peripheral surface portion 30b. The second region 28 has a well 32 therein extending toward the central area 26a thereby forming a central zone 28a which is thinner than a peripheral zone 28b. A third region 34 having a surface 36 is on the surface 30 of the second region 28. A first electrical contact 38 is on the surface 36 and a second electrical contact layer 40 is on the second major surface 16. The photodetector 10 also has a contoured sidewall 42.

The photodetector 50 of FIG. 2 includes a third region 34 having a planar surface 52 and a central portion 34a which is thicker than a peripheral portion 34b. The central portion 34a extends towards the central area 26a from the surface 52 through the second region 28 but cannot extend into the first region 24.

The substrate 12 and the absorptive, buffer and first regions 18, 20 and 24 are of the same conductivity type and the third region 34 is of the opposite conductivity type. The second region 28 may be either $\pi$- or $\nu$-type conducting and has a lower excess concentration of conductivity modifiers than the first region 24.

The materials comprising all the regions are preferably chosen such that their lattice constants are matched to that of the substrate 12 to within about 0.5 percent.

The substrate 12 is composed of a semiconductor material such as N-type InP doped with sulfur to a concentration of about $5 \times 10^{18}/cm^3$, has sufficient thickness to support the structure and is typically between about 0.03 and 0.04 cm thick. The substrate surface is typically treated with Caro's acid and a one percent bromine-in-methanol solution to remove surface contamination and damage prior to the deposition of the layers.

The absorptive region 18 is composed of a semiconductor material which absorbs light at the wavelength of interest in the range between 1100 and 1700 nm and is preferably greater than about 3 $\mu$m thick. Suitable materials include $In_{0.53}Ga_{0.47}As$ which absorbs at wavelengths less than 1650 nm and $In_xGa_{1-x}As_yP_{1-y}$ which absorbs light at wavelengths less than a maximum wavelength determined by the choice of x and y as disclosed, for example, by Olsen et al. in the Journal of Electronic Materials 9, 977 (1980). This region is preferably slightly $\nu$-type conducting, and is typically deposited as undoped material containing less than about $3 \times 10^{15}$ donors/cm$^3$.

The buffer region 20 is composed of a semiconductor material, typically $In_aGa_{1-a}As_bP_{1-b}$ having a graded or fixed bandgap energy between that of the absorptive region 18 and that of the first region 24 and is typically about 0.5 $\mu$m thick. Typically the concentration of conductivity modifiers in this region is the same as that in the absorptive region 18. This region is present to avoid the slow detector response associated with the accumulation of charge carriers near the valence-band discontinuity at the heterojunction but may be omitted.

The first region 24 is composed of a semiconductor material, such as N-type InP, having a thickness and conductivity modifier concentration sufficient to produce avalanche multiplication of carriers photogenerated in the absorptive region 18 adjacent to the central surface area 26a when a reverse-bias of sufficient magnitude is applied between the electrical contacts 38 and 40. This region is between about 0.5 and 3 μm thick and contains an excess areal concentration of conductivity modifiers between about 2.5 and $4 \times 10^{12}/cm^2$. The corresponding volume concentration is between 1 and $8 \times 10^{16}/cm^3$, preferably between about 2 and $5 \times 10^{16}/cm^3$.

The second region 28 is composed of a low-conductivity semiconductor material, such as InP, containing about $10^{16}$ acceptors or donors/$cm^3$ or less, with the concentration of conductivity modifiers being preferably a factor of at least two less than the concentration in the first semiconductor region 24. The thickness of the peripheral zone 28b is preferably such that it is not fully depleted by the applied voltage and is between about 2 and μm thick. The thickness of the central zone 28a is preferably greater than zero in order to avoid breakdown at the curved portions of surface 30 and is preferably less than about 0.5 μm in order to limit the total operating voltage of the photodiode.

The well 32 typically extends a distance between about 2 and 8 μm into the second region 28 and preferably does not contact the central area 26a.

The third region 34 is composed of a high-conductivity semiconductor material, such as P+-type InP, containing about $10^{18}$ acceptors/$cm^3$ and having a thickness in its peripheral portion 34b between about 1 and 2 μm. In the photodetector 50 of FIG. 2 the central portion 34a is between about 2 and 10 μm thick.

The substrate 18 and the first, second and third regions 24, 28 and 34, respectively, are preferably light-transmissive at the wavelength to be detected.

The first electrical contact 38 is composed of a gold-/zinc alloy deposited by vacuum evaporation if the third region 34 is P-type and is typically configured so that light enters the detector through that portion of the third region 34 over the central zone 28a. The second electrical contact 40 is composed of a gold/tin alloy deposited by vacuum evaporation if the substrate 12 is N-type.

Figure 3:
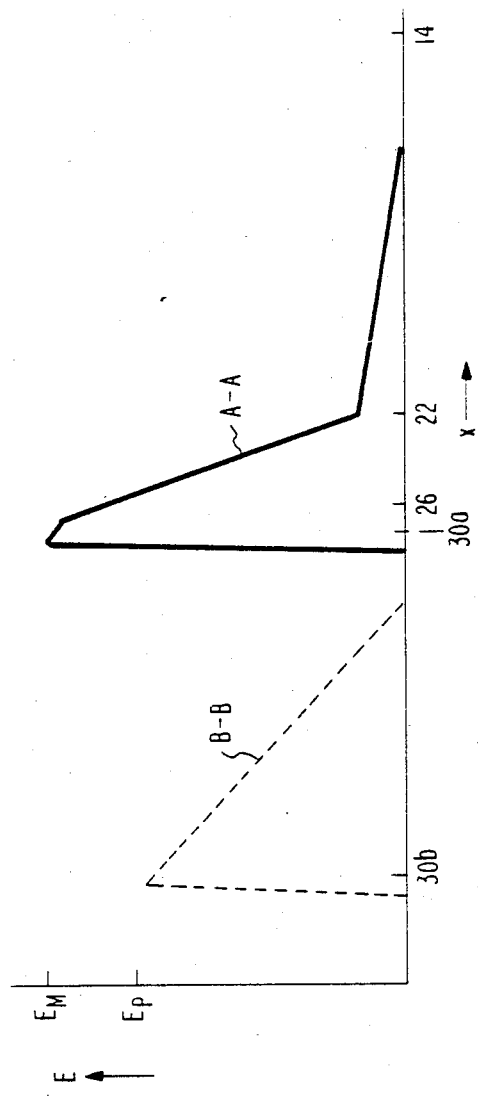
FIGS. 3 and 4 are graphical illustrations of the electric field under reverse bias along the lines A—A and B—B for different conductivity types of the second region 28 of the photodetector of the invention.
Figure 4:
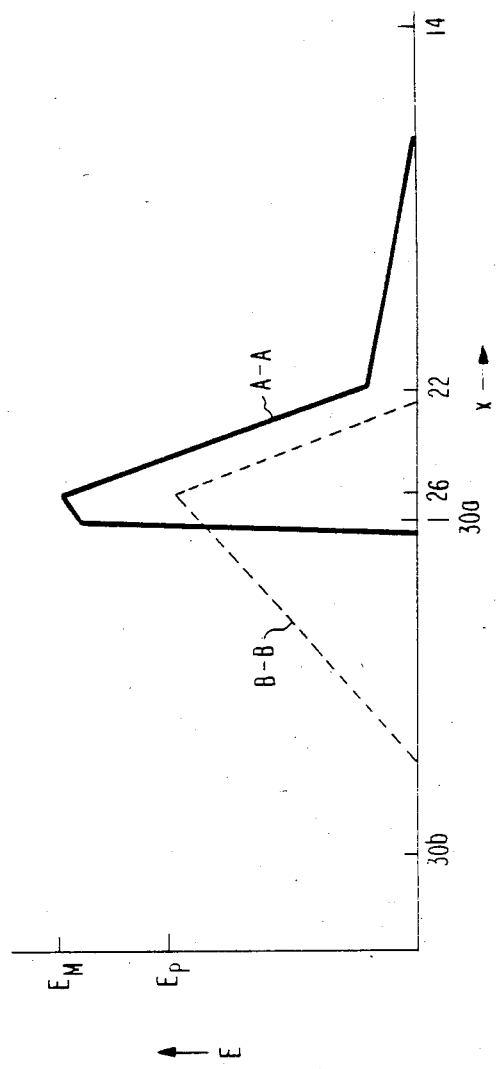

The electric field distribution along the lines A—A and B—B of FIGS. 1 or 2 are shown in FIG. 3 for the case where the second and third regions 28 and 34 are of the same conductivity type opposite to that of the first region 24 to provide a P-N junction at the surface 26. For the case where the first and second regions 24 and 28 are of the same conductivity type opposite to that of the third region 34 to provide a P-N junction at the surface 30, the field distribution is shown in FIG. 4. In FIGS. 3 and 4 the abscissae are labelled with the numerical identifications of the different surfaces or portions thereof as defined in FIG. 1. In both cases the depletion width in the first region 24 along the line A—A increases with increasing voltage, reaching a value between about 3.5 and $5 \times 10^5$ V/cm when the first region 24 is fully depleted. A further increase in the applied voltage causes the depletion width to extend into the absorptive and buffer regions 18 and 20. The electric field in these regions does not increase beyond about $1.5 \times 10^5$ V/cm before the electric field $E_m$ sufficient for avalanche breakdown occurs in the first region 24. This electric field distribution is illustrated as the solid curves in FIGS. 3 and 4.

The peripheral zone 28b, whether π- or ν-type, does not fully deplete with the application of the reverse-bias voltage. Since the peripheral zone 28b is lightly doped, the maximum electric field $E_p$ at the P-N junction along the lines B—B in FIGS. 1 and 2 will be less than that along the lines A—A and also less than the field required for avalanche multiplication. These electric field distributions along the line B—B are shown as the broken curves in FIGS. 3 and 4, respectively.

The electric field under reverse bias can be expressed in terms of the impurity concentration and the thickness of the first region 24 and the central zone 28a and the impurity concentration and depletion width in the absorptive region 18. Assuming an abrupt P-N junction at the surface 30, the second region 28 is ν-type and including the buffer region 20 with the absorptive region 18, the electric field $E_m$ is:

$$E_m = q/\epsilon[N_2 y_c + N_1 x_1 + N_0 w_c]$$

where q is the electronic charge, $\epsilon$ is the dielectric constant, $N_2$ is the conductivity modifier concentration and $y_c$ the thickness of the central zone 28a and $N_1$ is the conductivity modifier concentration, $x_1$ is the thickness of the first region 24, $N_0$ is the conductivity modifier concentration and $w_c$ is the depletion region width in the central part of the absorptive region 18. The first and second terms represent the field necessary just to deplete the first region 24 and the central zone 28a.

For this case, if the peripheral zone 28b is not fully depleted, the electric field is approximately:

$$E_p = \left(\frac{2qN_2 V}{\epsilon}\right)^{\frac{1}{2}}$$

where V is the applied voltage.

Assuming an abrupt P-N junction at the surface 26 for the case where the second region 28 is π-type and including the buffer region 20 with the absorptive region 18, the electric field $E_m$ under reverse bias is:

$$E = q/\epsilon[N_1 x + N_0 w_c].$$

The first term is the field necessary just to deplete the first region, and the second term is the field at surface 22. For this case, if the peripheral zone 28b and the first region 24 are not fully depleted by the applied bias voltage, the electric field $E_p$ is approximately:

$$E_p = \left[\left(\frac{2qV}{\epsilon}\right) \cdot \left(\frac{N_1 N_2}{N_1 + N_2}\right)\right]^{\frac{1}{2}}.$$

In each case, the voltage for avalanche is the integral of the electric field over the full width of the depletion regions. For either case the parameters of thickness and impurity concentration are preferably chosen to give an avalanche voltage in the central region between 25 and 75 volts, and a peak field $E_p$ less than $4 \times 10^5$ V/cm.

The semiconductor layers which form the regions may be sequentially formed on the substrate surface using liquid-phase or, preferably, vapor-phase epitaxy techniques such as those disclosed by Olsen et al. in U.S. Pat. No. 4,116,733, incorporated herein by reference. ν-type absorptive and buffer layers, a first N-type InP layer and a second ν- or π-type InP layer all having the appropriate conductivity modifier concentrations are sequentially deposited on an N-type InP substrate wafer by vapor-phase epitaxy techniques. Portions of the surface of the second layer are covered with an etch-resistant mask such as SiO$_2$ using standard photolithographic and etching techniques and the wells are formed by chemical etching using a one percent bromine-in-methanol solution. The etching mask is removed, a P+-type InP third layer is deposited on the second layer in the wells. The third layer and the substrate are then metallized to form the electrical contacts. Mesas are then etched into the layers and the diodes are separated using conventional techniques. Alternatively the P+-type third region could be formed using well-known ion implantation and/or diffusion techniques.

The photodetector 50 may be formed by sequentially depositing absorptive, buffer, first, second and third semiconductor layers having the appropriate conductivity modifier concentrations, as above, onto an N+-InP substrate. An SiO$_2$ ion-implantation mask having a plurality of openings therein is formed on the third semiconductor layer. Conductivity modifiers of the same type as used for the third layer are then implanted through the third layer into the second layer and activated to form the thicker portion 34a. If the third layer has P-type conductivity, beryllium is a suitable dopant for the deep implantation required.

I claim:

1. An avalanche photodetector comprising:
  - a substrate of first conductivity type having a first major surface;
  - a light-absorptive region of first conductivity type overlying said first major surface;
  - a first region of first conductivity type overlying said absorptive region and having a surface comprising a central area and a peripheral area;
  - a second region comprising a central zone over said central area and a peripheral zone over said peripheral area wherein said second region has a well therein over said central area and extending towards said central area and said central zone is thinner than said peripheral zone;
  - a third region of opposite conductivity type overlying said second region;
  - a first electrical contact to said third region; and
  - a second electrical contact to said substrate.

2. The photodetector of claim 1 wherein the areal concentration of conductivity modifiers in said first region is between about 2.5 and $4 \times 10^{12}/cm^2$.

3. The photodetector of claim 2 further comprising a buffer region of first conductivity type between said absorptive and first regions.

4. The photodetector of claim 3 wherein said first region is composed of N-type InP, said third region is composed of P-type InP and said absorptive region has ν-type conductivity and is composed of a material selected from the group consisting of $In_{0.57}Ga_{0.43}As$ and $In_xGa_{1-x}As_yP_{1-y}$ alloys.

5. The photodetector of claim 4 wherein said second region has ν-type conductivity.

6. The photodetector of claim 4 wherein said second region has π-type conductivity.

* * * * *